(12) United States Patent
Zhang

(10) Patent No.: US 8,540,386 B2
(45) Date of Patent: Sep. 24, 2013

(54) BACKLIGHT MODULE AND DISPLAY APPARATUS

(75) Inventor: Pangling Zhang, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 196 days.

(21) Appl. No.: 12/991,705

(22) PCT Filed: Sep. 30, 2010

(86) PCT No.: PCT/CN2010/077534
§ 371 (c)(1),
(2), (4) Date: Nov. 9, 2010

(87) PCT Pub. No.: WO2011/157015
PCT Pub. Date: Dec. 22, 2011

(65) Prior Publication Data
US 2011/0310588 A1    Dec. 22, 2011

(30) Foreign Application Priority Data

Jun. 17, 2010   (CN) .......................... 2010 1 0206702

(51) Int. Cl.
*G09F 13/04*   (2006.01)
(52) U.S. Cl.
USPC ........................ 362/97.3; 362/97.2; 362/218
(58) Field of Classification Search
USPC ...................................... 362/97.2–97.3, 218
See application file for complete search history.

(56) References Cited

U.S. PATENT DOCUMENTS

| | | | |
|---|---|---|---|
| 7,338,186 B1 * | 3/2008 | Wu et al. | 362/294 |
| 7,748,876 B2 * | 7/2010 | Zhang et al. | 362/373 |
| 2003/0052584 A1 | 3/2003 | Matsui et al. | |
| 2008/0025023 A1 * | 1/2008 | Hsieh et al. | 362/249 |
| 2008/0150126 A1 * | 6/2008 | Zhou et al. | 257/712 |
| 2008/0170400 A1 * | 7/2008 | Maruyama | 362/294 |
| 2009/0040760 A1 * | 2/2009 | Chen et al. | 362/249 |
| 2009/0135594 A1 * | 5/2009 | Yu et al. | 362/234 |

FOREIGN PATENT DOCUMENTS

| | | |
|---|---|---|
| CN | 1760734 A | 4/2006 |
| CN | 1805133 A | 7/2006 |
| CN | 1805671 A | 7/2006 |
| CN | 1991459 A | 7/2007 |
| CN | 101017282 A | 8/2007 |
| CN | 101047045 A | 10/2007 |
| CN | 200965439 Y | 10/2007 |
| CN | 201187731 Y | 1/2009 |
| JP | 2008293817 A | 12/2008 |

* cited by examiner

*Primary Examiner* — Sean Gramling
(74) *Attorney, Agent, or Firm* — Ditthavong Mori & Steiner, P.C.

(57) ABSTRACT

The present invention provides a backlight module and a display apparatus. The backlight module comprises a heat dissipation plate, a back bezel and at least one light source. The heat dissipation plate includes a plurality of fluid channels and a heat dissipation fluid, wherein the heat dissipation fluid flows in the fluid channels. The back bezel is disposed on the heat dissipation plate. The at least one light source disposed on the back bezel. The display apparatus comprises the backlight module and a display panel. The present invention can raise the heat dissipation efficiency of the backlight module.

10 Claims, 4 Drawing Sheets

BACKLIGHT MODULE AND DISPLAY APPARATUS

FIELD OF THE INVENTION

The present invention relates to a backlight module and a display apparatus, and more particularly to a backlight module and a display apparatus for raising heat dissipation efficiency.

BACKGROUND OF THE INVENTION

Liquid crystal displays (LCDs) have been widely applied in electrical products. Currently, LCDs mostly comprise a liquid crystal panel and a backlight module disposed behind the panel. According to the position of the backlight source, the backlight module can be an edge-lighting type or a bottom-lighting type in order to provide LCDs with backlight.

The heat generated by the LCDs which is in working status may affect the efficiency thereof, and thus the heat dissipation thereof is very important. Taking the bottom-lighting type backlight module for example, it may use light emitting diodes (LED) to be the backlight source, and currently it uses a heat dissipation module with heat sinks, an external fan or heat pipes with capillary structures to improve the heat dissipation thereof.

However, the heat sinks and the external fan may increase the entire thickness of the backlight module, and are also hard to meet the requirement of the heat dissipation of the LCDs. The heat pipes with capillary structures are uneasy to be processed, thereby increasing the manufacturing cost. Furthermore, according to the heat dissipation structure of the current backlight module, an uneven temperature problem is susceptible to occur. Therefore, a back bezel of the backlight module may deform due to the temperature uneven problem.

As a result, it is necessary to provide a backlight module and a display apparatus to solve the problems existing in the conventional technologies, as described above.

SUMMARY OF THE INVENTION

A primary object of the present invention is to provide a backlight module, wherein the backlight module comprises:
 a heat dissipation plate including a plurality of fluid channels and a heat dissipation fluid, wherein the heat dissipation fluid flows in the fluid channels;
 a back bezel disposed on the heat dissipation plate; and
 at least one light source disposed on the back bezel.

A secondary object of the present invention is to provide a display apparatus, wherein the display apparatus comprises:
 a display panel; and
 a backlight module comprising:
 a heat dissipation plate including a plurality of fluid channels and a heat dissipation fluid, wherein the heat dissipation fluid flows in the fluid channels;
 a back bezel disposed on the heat dissipation plate; and
 at least one light source is disposed on the back bezel.

A further object of the present invention is to provide a display apparatus, wherein the display apparatus comprises:
 a display panel; and
 a backlight module comprising:
 a heat dissipation plate including a plurality of fluid channels and a heat dissipation fluid, wherein the heat dissipation fluid flows in the fluid channels;
 a back bezel disposed on the heat dissipation plate; and
 at least one light source is disposed on the back bezel;
 wherein the heat dissipation plate further includes a first plate, at least one channel forming unit and a second plate, and the at least one channel forming unit is disposed between the first plate and the second plate for forming the fluid channels.

In one embodiment, the heat dissipation plate further includes a first plate, at least one channel forming unit and a second plate, and the at least one channel forming unit is disposed between the first plate and the second plate for forming the fluid channels.

In one embodiment, there is a pressure difference between inlets and outlets of the fluid channels, and the predetermined pressure may be formed by a pressuring device.

In one embodiment, the channel forming unit may be U-shaped metal pipes and correspond to the position of the light source for heat dissipation.

In one embodiment, the at least one channel forming unit is a rid of a continuous wave structure.

In one embodiment, the at least one channel forming unit is at least one metal pipe.

In one embodiment, the cross-sectional shape of each of the fluid channels is triangle, rectangle, trapezoid or circular.

In one embodiment, the first plate directly contacts with the back bezel.

In one embodiment, a material with high heat conductivity is filled between the first plate and the back bezel.

In one embodiment, the position of the fluid channels corresponds to the position of the light source.

In one embodiment, the heat dissipation fluid is gas.

In one embodiment, the heat dissipation fluid is liquid.

In one embodiment, the heat dissipation fluid flows under a predetermined pressure.

The backlight module and the display apparatus of the present invention can utilize the heat dissipation plate, which has heat dissipation can fluid flowing therein, to dissipate heat, thereby significantly raising the heat dissipation efficiency in the limited space and improving the deformation problem due to uneven temperature distribution.

DETAILED DESCRIPTION OF THE PREFERRED EMBODIMENTS

Figure 1:
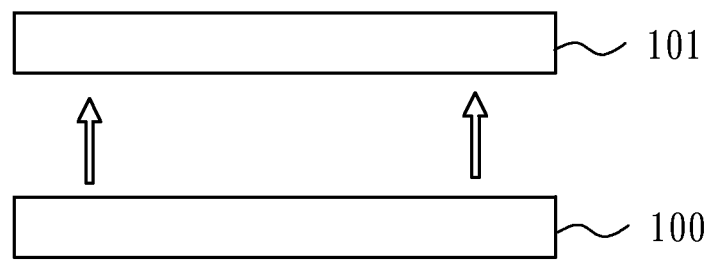
FIG. 1 is a cross-section view showing a display panel and a backlight module according to a first embodiment of the present invention.

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

In the drawings, like reference numerals indicate like components or items.

Figure 2:
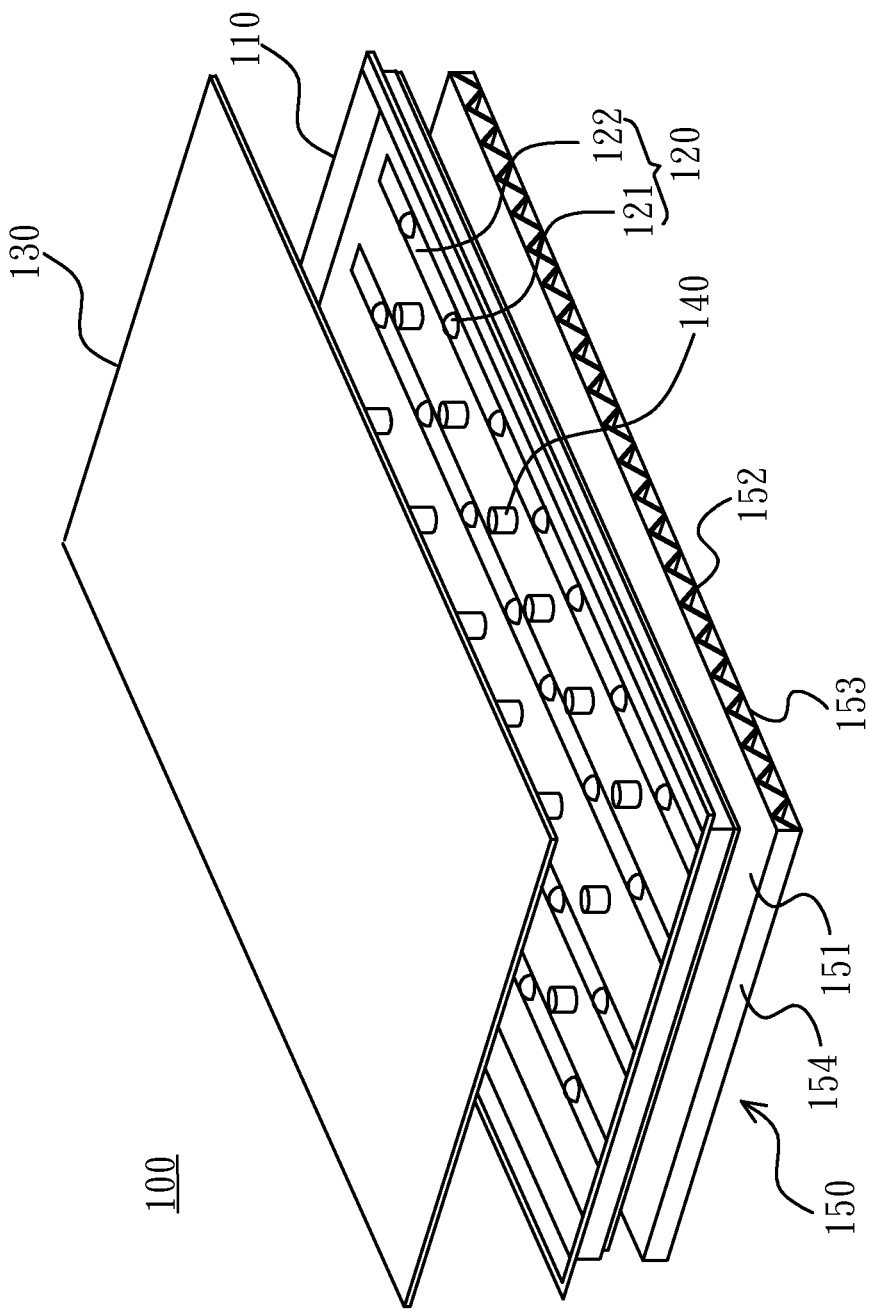
FIG. 2 is an exploded view showing a backlight module according to a first embodiment of the present invention.
Figure 3:
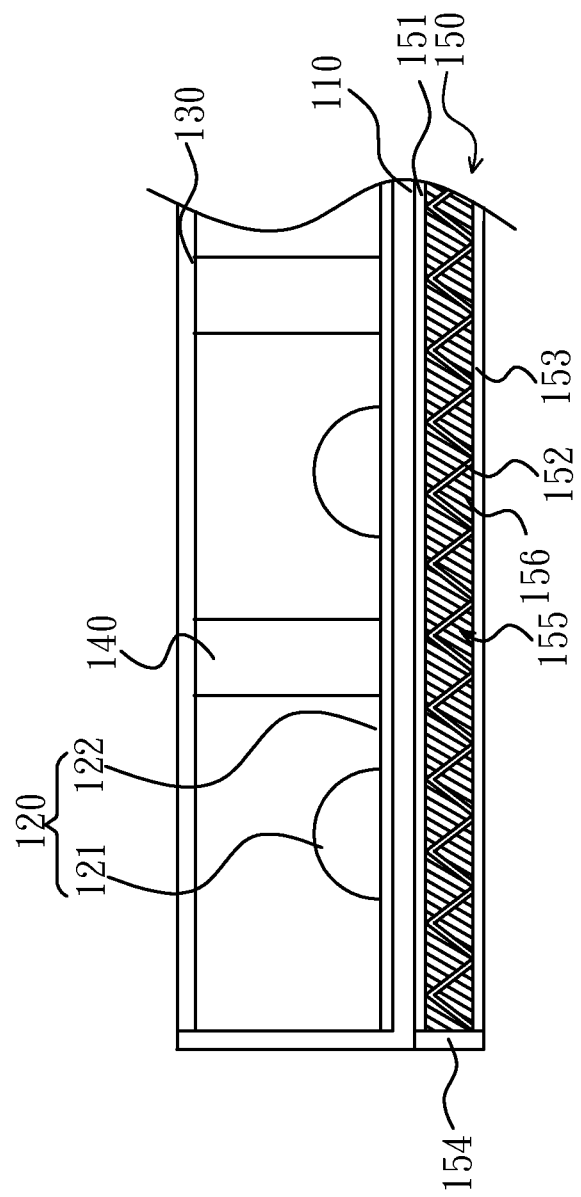
FIG. 3 is a partially cross-section view showing a backlight module according to a first embodiment of the present invention.

Referring to FIG. 1 through FIG. 3, FIG. 1 is a cross-section view showing a display panel and a backlight module according to a first embodiment of the present invention, and FIG. 2 is an exploded view showing a backlight module according to a first embodiment of the present invention, and FIG. 3 is a partially cross-section view showing a backlight module according to a first embodiment of the present invention. The backlight module 100 of the present embodiment may be for example a bottom-lighting type and disposed opposite to a display panel 101 (such as a liquid crystal display panel), thereby forming a display apparatus (an LCD apparatus). The backlight module 100 may comprise a back bezel 110, at least one light source 120, optical films 130, a plurality of supporting pillars 140 and heat dissipation plate 150. The back bezel 110 is disposed on the heat dissipation plate 150 for carrying the light source 120 and the optical films 130. The light source 120 is disposed on the back bezel 110 for emitting light to the display panel 101. The optical films 130 are disposed above the at least one light source 120 for improving the light uniformity and the light emitting efficiency thereof. The supporting pillars 140 are disposed on the back bezel 110 for supporting the optical films 130. Therefore, the optical films 130 can be supported above the at least one light source 120 by the supporting pillars 140. The heat dissipation plate 150 is disposed at one side (the bottom side) of the back bezel 110 and opposite to the optical films 130 for dissipating the heat generated by the backlight module 100 in a working status.

Referring to FIG. 2 and FIG. 3 again, the back bezel 110 of the present embodiment may be made of an opaque material, such as plastic, metal or any combination material thereof for carrying the light source 120 and the optical films 130. A highly reflective material, such as Au, Ag, Al, Au, Cr, Cu, In, Ir, Ni, Pt, Re, Rh, Sn, Ta, W, Mn, white paint with etiolation-resistant and heat-resistant properties or any combination thereof, can be formed or coated on the inside sidewall of the back bezel 110 for reflecting light.

Referring to FIG. 2 and FIG. 3 again, the at least one light source 120 of the present embodiment may be light emitting diodes (LED), an organic light emitting diode (OLED), cold cathode fluorescent lamp (CCFL), an electro-luminescence (EL) device or a light bar. In the present embodiment, the at least one light source 120 may be a plurality of LED light bars arranged on the other side (the lighting side) of the back bezel 110. Each of the LED light bars may be composed of a plurality of LED chips 121 and a circuit broad 122 (such as a printed circuit board), wherein the LED chips 121 can be disposed on the circuit broad 122 for lighting.

Referring to FIG. 2 and FIG. 3 again, the optical films 130 of the present embodiment may be a diffuser, a prism sheet, a brightness enhancement film, a dual brightness enhancement film, a diffused reflective polarizer film or any combination thereof and is disposed above the at least one light source 120.

Referring to FIG. 2 and FIG. 3 again, the supporting pillars 140 of the present embodiment are disposed on the lighting side of the back bezel 110 for supporting the optical films 130, thereby improving the deflection problem of the optical films 130 resulting from the weight thereof. The supporting pillars 140 are formed on the back bezel 110 as one piece. However, the forming of the supporting pillars 140 is not limited to this. The supporting pillars 140 can also be disposed on the back bezel 110 by welding, bonding or screwing.

Referring to FIG. 2 and FIG. 3 again, the heat dissipation plate 150 of the present embodiment may be disposed on the bottom side of the back bezel 110 for improving the heat dissipation of the backlight module 100. The back bezel 110 comprises a first plate 151, at least one channel forming unit 152, a second plate 153, a plurality of enclosing portions 154, a plurality of fluid channels 155 and a heat dissipation fluid 156. The first plate 151, the at least one channel forming unit 152, the second plate 153 and the enclosing portions 154 may be made of a metal material with great thermal conductivity, such as Ag, Cu, Cu alloy, Cu—Ag alloy, Al, Al alloy or any alloy thereof, for increasing the heat dissipation efficiency thereof. The first plate 151 of the heat dissipation plate 150 may be fixed on the bottom side of the back bezel 110 by welding or screwing. At this time, the first plate 151 can directly contact with the back bezel 110 for transmitting the heat from the back bezel 110. In one embodiment, a material with high heat conductivity may be filled between the first plate 151 of the heat dissipation plate 150 and the back bezel 110 for reducing the heat resistance there between.

Referring to FIG. 2 and FIG. 3 again, the at least one channel forming unit 152 of the heat dissipation plate 150 of the present embodiment is disposed between the first plate 151 and the second plate 153 for forming the fluid channels 155 there between. In the present embodiment, the at least one channel forming unit 152 may be a W-shaped rid of a continuous wave structure or rid formed by assembling a plurality of individual and identical sections together, thereby dividing the space between the first plate 151 and the second plate 153 to form a plurality of the elongated fluid channels 155 arranged in parallel.

Referring to FIG. 2 and FIG. 3 again, the enclosing portions 154 of the heat dissipation plate 150 of the present embodiment are disposed at least two sides of the channel forming unit 152 for enclosing the heat dissipation plate 150 and exposing the inlets and the outlets of the fluid channels 155. The fluid channels 155 are formed by the channel forming unit 152. Therefore, and thus the shape of the fluid channels 155 corresponds to the shape of the channel forming unit 152. For example, in the present embodiment, the elongated fluid channels 155 are formed by using the channel forming unit 152 of a continuous wave shape to divide the space between the first plate 151 and the second plate 153. The cross-sectional shape of each of the fluid channels 155 may be triangle, rectangle, trapezoid, circular or any other shape. The fluid channels 155 are configured to allow the heat dissipation fluid 156 flowing in the heat dissipation plate 150, wherein the inlets and the outlets of the fluid channels 155 may be formed at the same sides or different sides. The heat dissipation fluid 156 flows in the fluid channels 155 for transmitting heat from the interior of the heat dissipation plate 150 to the exterior thereof. Therefore, the heat dissipation fluid 156 can perform a heat exchange process in the heat dissipation plate 150 and improve the heat dissipation efficiency of the backlight module 100. The heat dissipation fluid 156 may be gas (such as air, N2, H2, He or Ar) or liquid (such as water or cooling agency) which flows under a predetermined pressure, i.e. there is a pressure difference between the inlets and the outlets of the fluid channels 155. The predetermined pressure may be formed by a pressuring device, such as a pump (not shown). If necessary, both ends of each two adjacent fluid channels 155 can be connected to each other by suitable way, thereby forming an S-shaped circulatory system.

Referring to FIG. 3 again, when the backlight module 100 provides backlight to the display panel 101, the light source 120 thereof is at a high temperature. At this time, the heat of the backlight module 100 can be transmitted through the back bezel 110 to the heat dissipation plate 150 and then dissipated by the heat dissipation plate 150. The heat of the backlight module 100 can be transmitted through the back bezel 110 to the first plate 151 of the heat dissipation plate 150 and then dissipated to the exterior thereof by the heat dissipation fluid 156 flowing therein, thereby improving heat dissipation efficiency.

Therefore, the backlight module 100 of the present embodiment can utilize the fluid channels 155 and the heat dissipation fluid 156 flowing therein of the heat dissipation plate 150 to improve heat dissipation efficiency. The shape, position, or size of the fluid channels 155 can be adjusted according to the real heat dissipation requirement. Furthermore, the heat dissipation plate 150 is disposed on the bottom side of the back bezel 110, and can support it and transmits the heat thereof rapidly, thereby uniforming the temperature distribution thereof. Therefore, the deformation problem due to uneven temperature distribution can be improved by the heat dissipation plate 150.

Figure 4A:
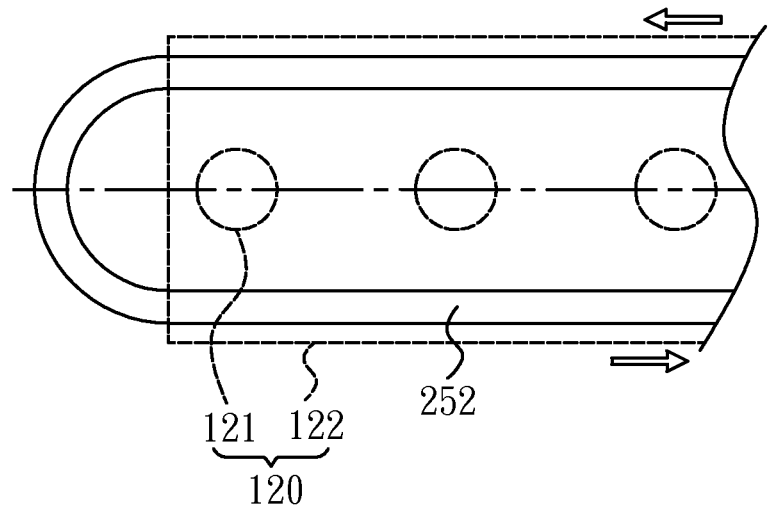
FIG. 4A is a partially top view showing a channel forming unit according to a second embodiment of the present invention.
Figure 4B:
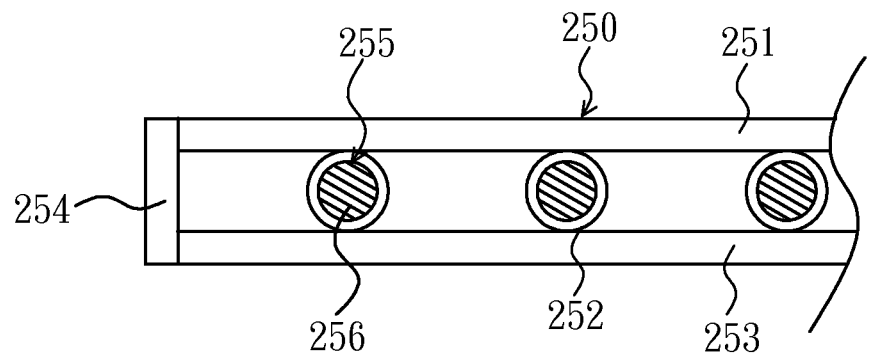
FIG. 4B is a partially cross-sectional view showing a heat dissipation plate according to a second embodiment of the present invention.

Referring to FIG. 4A and FIG. 4B, FIG. 4A is a partially top view showing a channel forming unit according to a second embodiment of the present invention, and FIG. 4B s a partially cross-section view showing a heat dissipation plate according to a second embodiment of the present invention. The construction of the second embodiment is similar to that in the first embodiment with respect to configuration and function, and thus is not stated in detail herein. In comparison with the first embodiment, the heat dissipation plate 250 of the second embodiment comprises a first plate 251, at least one channel forming unit 252, a second plate 253, a plurality of enclosing portions 254, a plurality of fluid channels 255 and a heat dissipation fluid 256. The channel forming unit 252 may be at least one metal pipe for allowing the heat dissipation fluid 256 flowing therein. For example, in the present embodiment, the channel forming unit 252 may be U-shaped metal pipes or a continuous S-shaped metal pipe. The fluid channels 255 are formed in the at least one metal pipe, and the inlets and the outlets of the fluid channels 255 may be formed at the same side of the heat dissipation plate 250. At this time, the position of the fluid channels 255 can correspond to the position of the light source 120 (such as LED light bar). For example, the symmetric central line of each of the U-shaped metal pipes may be positioned to the central position of the light source 120. In that manner, the U-shaped fluid channels 255 formed by the channel forming unit 252 can dissipate heat corresponding to the position of the light source 120, thereby rapidly and uniformly dissipating the heat of the backlight module 100, and meanwhile the heat dissipation efficiency and the deformation problem of the back bezel 110 can be improved.

As described above, the backlight module and the display apparatus of the present invention can utilize the heat dissipation plate disposed on the bottom side of the back bezel to dissipate heat. Since, the heat dissipation can fluid flows in the heat dissipation plate to perform the heat exchange process, the heat dissipation efficiency can be significantly raised in the limited space. Furthermore, the deformation problem due to uneven temperature distribution can be improved by the heat dissipation plate.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. A backlight module for illuminating a display panel comprising:
   a heat dissipation plate including a plurality of fluid channels and a heat dissipation fluid,
      wherein the heat dissipation fluid flows in the fluid channels;
   a back bezel disposed on the heat dissipation plate; and
   a plurality of light sources disposed on the back bezel, each light source linearly arranged on the back bezel,
   wherein the heat dissipation plate further includes at least one channel forming unit for forming the fluid channels, and the at least one channel forming unit are a plurality of U-shaped metal pipes arranged below each light source, respectively; wherein each U-shaped metal pipe comprises two parallel channels with a symmetric central line extending between the two parallel channels in a length direction of a respective light source such that each symmetric central line corresponds to a central position of the respective light source, the two parallel channels of each U-shaped metal pipe being offset from the central position of the respective light source such that the heat dissipation fluid flows around the respective light source.

2. The backlight module according to claim 1, characterized in that: the heat dissipation plate further includes a first plate and a second plate, and the at least one channel forming unit is disposed between the first plate and the second plate for forming the fluid channels.

3. The backlight module according to claim 2, characterized in that: there is a pressure difference between inlets and outlets of the fluid channels, and the predetermined pressure is formed by a pressuring device.

4. The backlight module according to claim 1, characterized in that: the cross-sectional shape of each of the fluid channels is triangle, rectangle, trapezoid or circular.

5. The backlight module according to claim 2, characterized in that: the first plate directly contacts with the back bezel.

6. The backlight module according to claim 2, characterized in that: a material with high heat conductivity is filled between the first plate and the back bezel.

7. The backlight module according to claim 1, characterized in that: the heat dissipation fluid is gas.

8. The backlight module according to claim 1, characterized in that: the heat dissipation fluid is liquid.

9. A display apparatus, comprising:
   a display panel; and
   a backlight module comprising:
   a heat dissipation plate including a plurality of fluid channels and a heat dissipation fluid,
      wherein the heat dissipation fluid flows in the fluid channels;
   a back bezel disposed on the heat dissipation plate; and
   a plurality of light sources disposed on the back bezel, each light source linearly arranged on the back bezel;
   wherein the heat dissipation plate further includes a first plate, at least one channel forming unit and a second plate, and the at least one channel forming unit is disposed between the first plate and the second plate for forming the fluid channels, and the at least one channel forming unit are a plurality of U-shaped metal pipes arranged below each light source, respectively; wherein each U-shaped metal pipe comprises two parallel channels with a symmetric central line extending between the two parallel channels in a length direction of a respective light source such that each symmetric central line corresponds to a central position of the respective light source, the two parallel channels of each U-shaped metal pipe being offset from the central position of the respective light source such that the heat dissipation fluid flows around the respective light source.

10. A display apparatus, comprising:
a display panel; and
a backlight module comprising:
a heat dissipation plate including a plurality of fluid channels and
a heat dissipation fluid, wherein the heat dissipation fluid flows in the fluid channels;
a back bezel disposed on the heat dissipation plate; and
a plurality of light sources disposed on the back bezel, each light source linearly arranged on the back bezel,
wherein the heat dissipation plate further includes at least one channel forming unit for forming the fluid channels, and the at least one channel forming unit are a plurality of U-shaped metal pipes arranged below each light source, respectively; wherein each U-shaped metal pipe comprises two parallel channels with a symmetric central line extending between the two parallel channels in a length direction of a respective light source such that each symmetric central line corresponds to a central position of the respective light source, the two parallel channels of each U-shaped metal pipe being offset from the central position of the respective light source such that the heat dissipation fluid flows around the respective light source.

\* \* \* \* \*